United States Patent
Yeh et al.

(10) Patent No.: US 8,439,693 B2
(45) Date of Patent: May 14, 2013

(54) SOCKET ASSEMBLY WITH A PICK UP CAP LINKING WITH A LOADING PLATE

(75) Inventors: Cheng-Chi Yeh, New Taipei (TW); Andrew Cheng, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 2 days.

(21) Appl. No.: 13/303,028

(22) Filed: Nov. 22, 2011

(65) Prior Publication Data
US 2012/0156919 A1      Jun. 21, 2012

(51) Int. Cl.
*H01R 13/44* (2006.01)

(52) U.S. Cl.
USPC .......................................................... 439/135

(58) Field of Classification Search .................. 439/133, 439/135, 331, 41
See application file for complete search history.

(56) References Cited

U.S. PATENT DOCUMENTS

| | | | | |
|---|---|---|---|---|
| 6,899,553 | B2* | 5/2005 | Ma et al. | 439/135 |
| 7,001,197 | B2* | 2/2006 | Shirai et al. | 439/331 |
| 7,070,427 | B2* | 7/2006 | Liao et al. | 439/135 |
| 7,070,428 | B2* | 7/2006 | Ma | 439/135 |
| 7,121,844 | B2* | 10/2006 | Ma | 439/73 |
| 7,708,571 | B2* | 5/2010 | Terhune et al. | 439/135 |
| 7,828,565 | B2* | 11/2010 | Ma et al. | 439/135 |
| 8,052,439 | B2* | 11/2011 | Fan et al. | 439/135 |
| 8,142,201 | B2* | 3/2012 | Fan | 439/41 |

* cited by examiner

*Primary Examiner* — Chandrika Prasad
(74) *Attorney, Agent, or Firm* — Wei Te Chung; Ming Chieh Chang (57) ABSTRACT

A socket assembly comprises an insulating housing receiving a plurality of contacts, a pick up cap assembled on the insulating housing and a loading plate covering the insulating housing and the pick up cap. The pick up cap is pivotally assembled to one of the sidewalls of the insulative housing at an end thereof and has an operating portion at an opposite end thereof. The loading plate is provided with a latching piece to latch with the operating portion of the pick up cap, so that the loading plate can bring the pick up cap to open.

14 Claims, 9 Drawing Sheets

SOCKET ASSEMBLY WITH A PICK UP CAP LINKING WITH A LOADING PLATE

BACKGROUND OF THE INVENTION

1. Field of the Invention

The present invention relates to socket assembly, more particularly to a socket assembly electrically connecting an IC package to a printed circuit board.

2. Description of Related Art

U.S. Pat. No. 7,001,197 issued on Feb. 21, 2006, discloses a traditional socket assembly for electrically connecting an IC package to a printed circuit board. The socket assembly comprises an insulative housing, a plurality of contacts received in the insulative housing, a stiffener disposed around the insulative housing, a loading plate pivotally assembled to an end of the stiffener and a loading lever pivotally assembled to an opposite end of the stiffener. The socket assembly usually is equipped with a pick up cap, the pick up cap can be assembled to the insulative housing and exposed from an opening of the loading plate for being picked up, the pick up cap has two functions, one is to provide a smooth surface for sucking by a pick up tool to move the socket assembly, the other is to protect the terminals received in the socket assembly from exterior dust or outside force.

The pick up cap of the socket assembly needs to be removed before using, operator must firstly open the loading plate, and then upwardly pick the pick up cap disposed upon the insulative housing by fingers, however, once the operator makes a mistake during this process, the pick up cap will drop down and even crash the contacts received in the insulative housing, that may destroy the socket assembly.

Hence, an improved socket assembly is desired to overcome the above problems.

BRIEF SUMMARY OF THE INVENTION

To achieve the above-mentioned object, a socket assembly comprises an insulative housing receiving a plurality of contacts and having a plurality of sidewalls, a pick up cap assembled on the insulative housing, and a fastening equipment comprising a loading plate covering the insulative housing and the pick up cap. The pick up cap is pivotally assembled to one of the sidewalls of the insulative housing at an end thereof and has an operating portion at an opposite end thereof The loading plate links with the operating portion of the pick up cap and brings the pick up cap to rotate when the loading plate is rotated to open from a horizontal position relative to the insulative housing.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Reference will be made to the drawing figures to describe the present invention in detail, wherein depicted elements are not necessarily shown to scale and wherein like or similar elements are designated by same or similar reference numeral through the several views and same or similar terminology.

Figure 1:
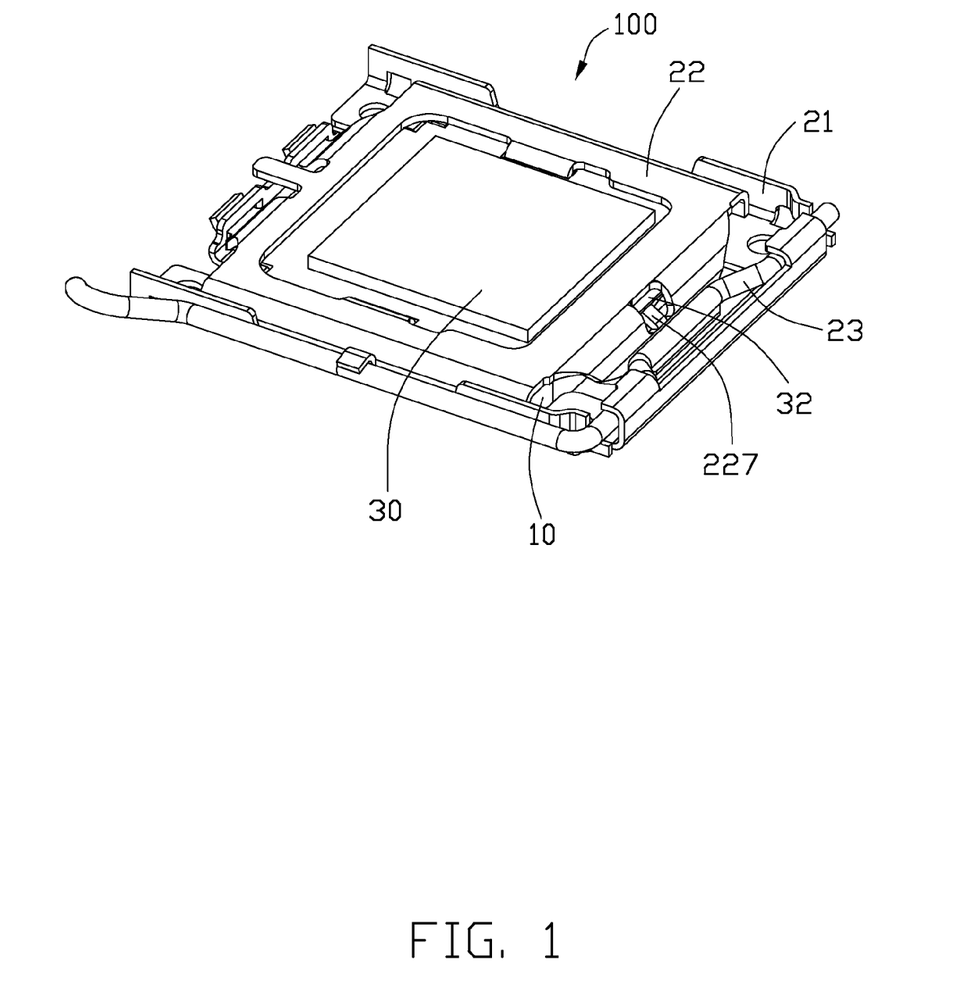
FIG. 1 is an assembled, perspective view of a socket assembly according to a preferred embodiment of the present invention.
Figure 2:
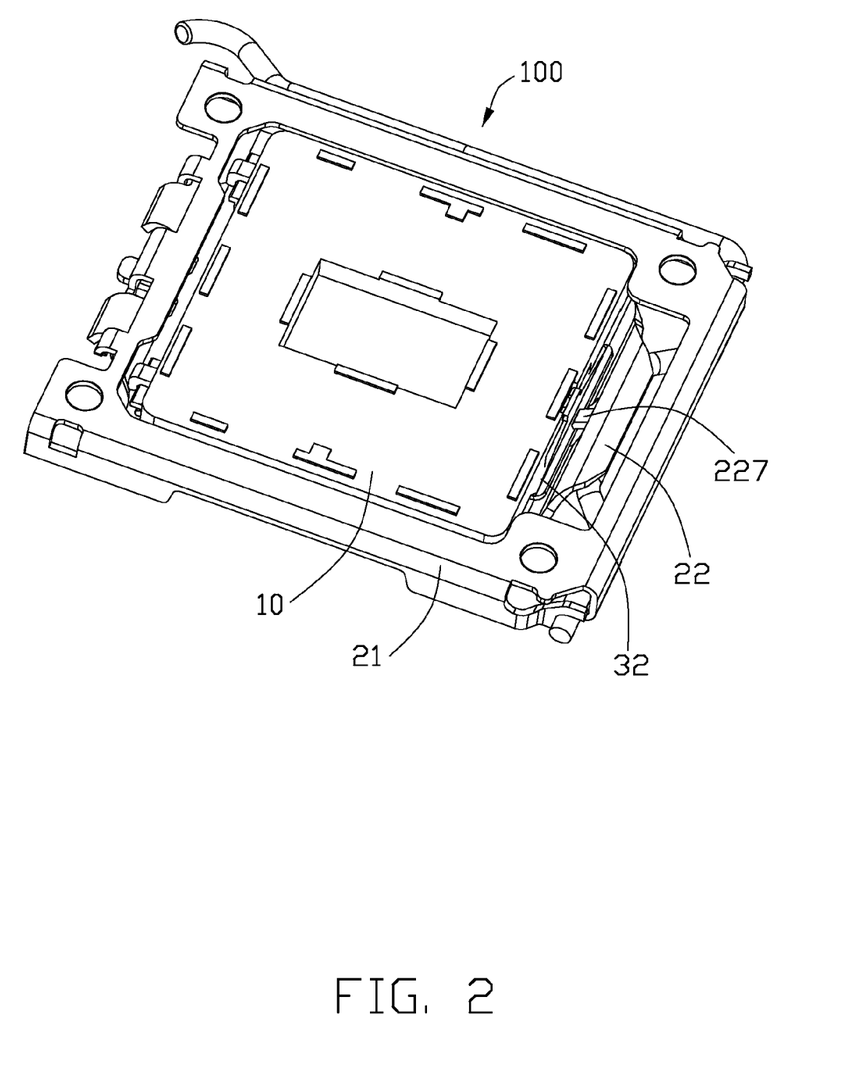
FIG. 2 is a view similar to FIG. 1, while taken from a different aspect.

Referring to FIGS. 1-2, the socket assembly 100, adapted for electrically connecting an IC package (not shown) to a printed circuit board (not shown), comprises an insulative housing 10, a plurality of contacts (not shown) received within the insulative housing 10, a pick up cap 30 assembled on the insulative housing 10 and a fastening equipment, the fastening equipment includes a stiffener 21, a loading plate 22 and a loading lever 23, they are all made from metal.

Figure 3:
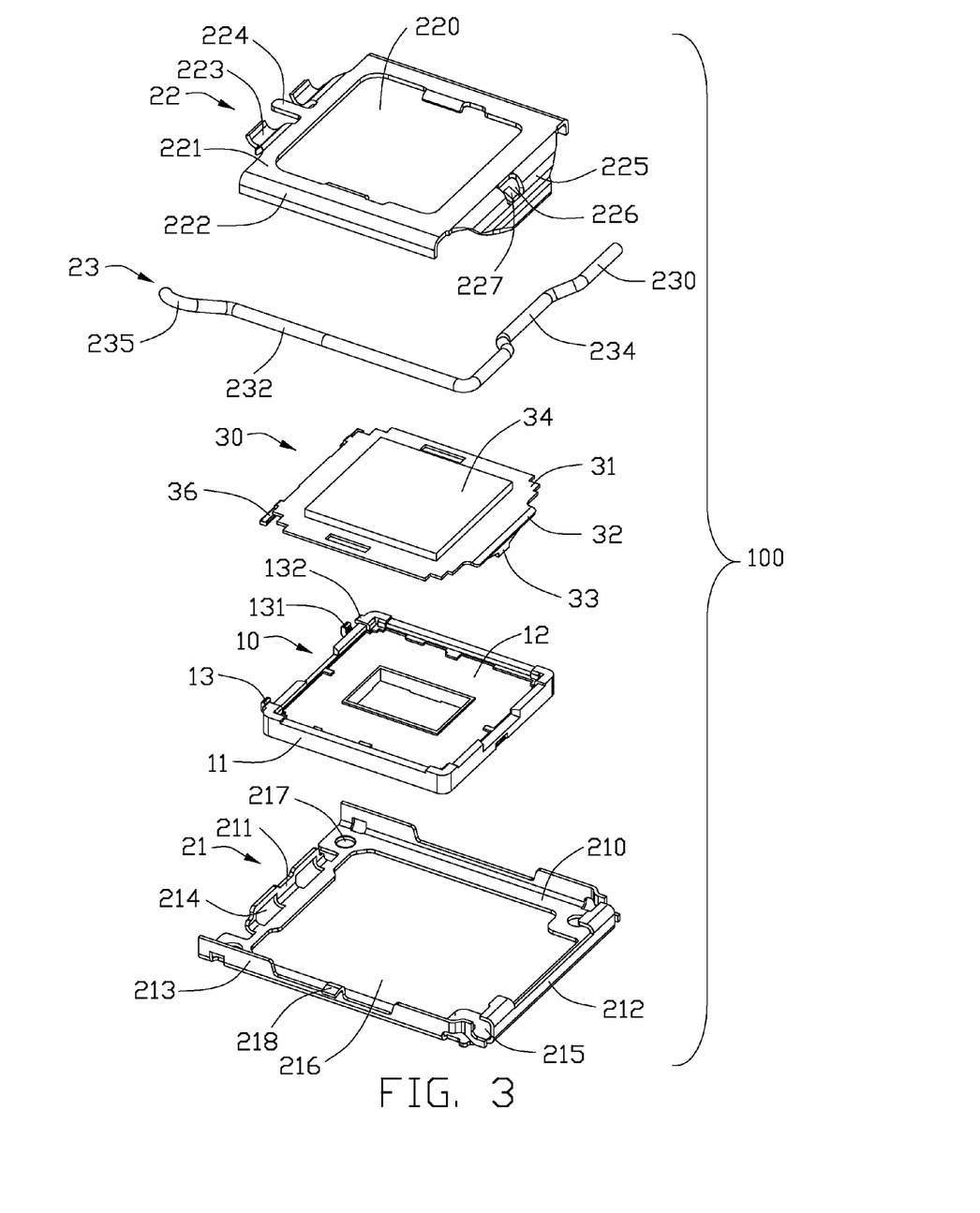
FIG. 3 is an exploded, perspective view of the socket assembly.

Referring to FIG. 3, the insulative housing 10 has a substantial rectangular shape, and is provided with a plurality of sidewalls 11 extending upwardly from a peripheral thereof and a receiving cavity 12 recessed downwardly from the top surface of the insulative housing 10, the contacts are arranged in matrix in the receiving cavity 12. The insulative housing 10 has a pair of mounting seats 13 located outside two ends of one of the sidewalls 11 for assembling the pick up cap 30.

Figure 4:
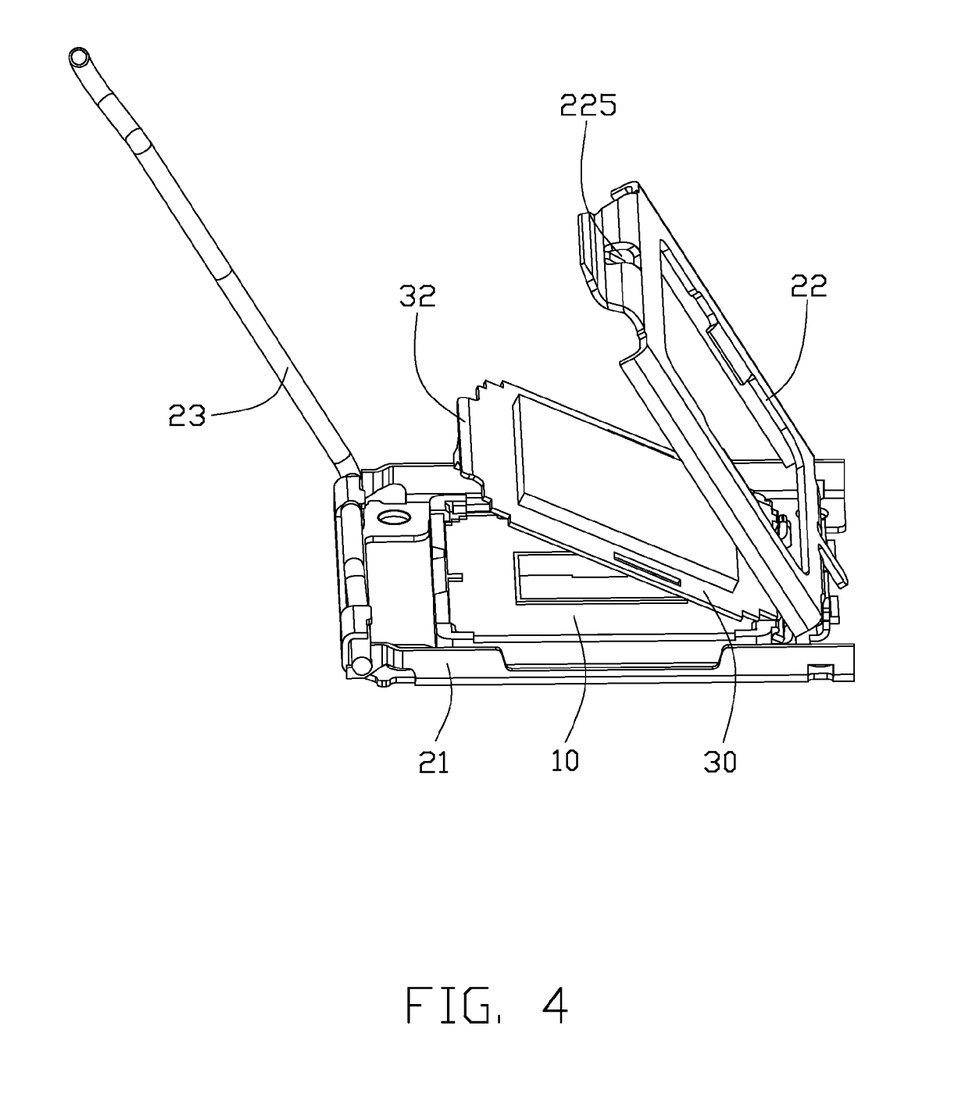
FIG. 4 is another assembled, perspective view of the socket assembly, showing the socket assembly in an opening state.
Figure 5:
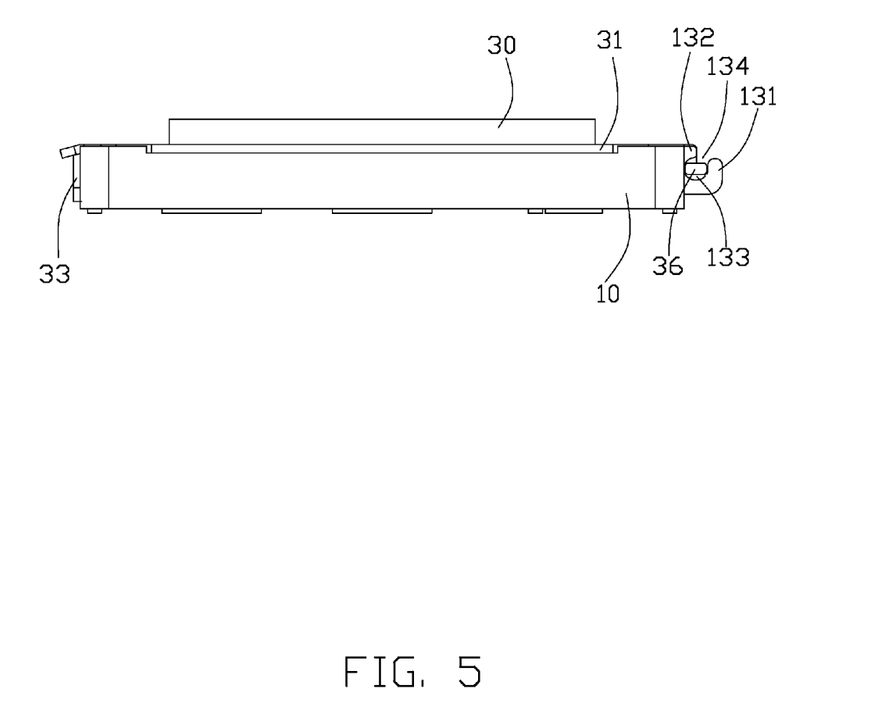
FIG. 5 is a side view of an insulative housing of the socket assembly and a pick up cap of the socket assembly assembled on the insulative housing, wherein the pick up cap is located in a horizontal position.

Referring to FIGS. 3 to 5, the mounting seat 13 has a base 131 and an accessorial seat 132 adjacent to the base 131. Both the base 131 and the accessorial seat 132 protrude outwardly from an outside surface of the sidewalls 11. The base 131 defines a first recess opening upwardly, the accessorial seat 132 defines a second recess opening downwardly, the first recess and the second recess cooperatively defines a mounting hole 133, and the accessorial seat 132 staggers with the base 131 in a manner that the accessorial seat 132 is located on an outside of the base 131. The mounting hole 133 substantially has a circular section and is completely situated outside the sidewall 11.

The pick up cap 30 substantially has an same areas as the insulative housing 10, the pick up cap 30 is formed with a planar main body 31 covering the receiving cavity 12 and an operating portion 32 beside the main body 31. The operating portion 32 projects from an edge of the main body 31 for being operated by fingers of operator. The operating portion 32 is formed with a latching arm 33 extending downwardly from a bottom thereof to latch with the insulative housing 10. The main body 31 has a protrusion 34 in the center thereof and a depression (not shown) on back of the protrusion 34 for receiving a top of the IC package in the cavity 12 of the insulative housing 10. The main body 31 further has a pair of pivots 36 on two opposite ends of the other edge of the main body 31 opposite to the operating portion 32. The pivot 36 is located below the main body 31 and horizontally extending along the other edge. The pivot 36 is received in the mounting hole 133 of the mounting seat 13 of the insulative housing 10 to pivotally assemble the pick up cap 30 to the insulative housing 10.

Referring to FIG. 3, the stiffener 21 has a bottom wall 210 and a plurality of sidewalls upwardly extending from the bottom wall 210, the sidewall includes a front wall 211 at the front, a rear wall 212 at the rear and two lateral walls 213 connecting the front wall 211 and the rear wall 212. The front wall 211 defines a pair of pivot holes 214 for assembling the loading plate 22, the rear wall 212 and the lateral wall 213 cooperatively defines a mounting room 215 for receiving the loading lever 23. The bottom wall 210 has an opening 216 for receiving the insulative housing 10, and inner edges of the opening 216 interfere with the sidewalls 11 of the insulative housing 10 to retain the insulative housing 10. The bottom wall 210 further defines four apertures 217 on four corners thereof, respectively, for bolts (not shown) passing through to fasten the socket assembly 100 on the printed circuit board (not shown).

The loading plate 22 substantially has a rectangular configuration, and comprises a main part 221 and edges 222 downwardly extending from the main part 221. The loading plate 22 has a pair of pivot arms 223 and a tab 224 disposed between the pivot arms 223. The loading plate 22 has a pressing portion 225 downwardly extending from a center part of a rear side of the main part 221. The loading plate 22 is rotatably assembled to the front of the stiffener 21 by the pivot arms 223 pivotally being assembled to the pivot holes 214 of the stiffener 21. The tab 224 abuts against the front wall 211 to prevent over-rotating of the loading plate 22.

The loading lever 23 has a pressing shaft 230 and an operating shaft 232 perpendicular to the retaining part 230 thereby forming the L-shaped lever 23. The pressing shaft 23 has a U-shaped bending portion 234 bent inwardly from a middle portion thereof for engaging with the load plate 22. The operating part 232 is provided with a handle 235 at a free end thereof The pressing shaft 230 is received in the mounting room 215 of the stiffener 21 to pivotally assemble the loading lever 23 to the rear of the stiffener 21, the operating shaft 232 is disposed beside one of the lateral wall 213 and locked by a locking portion 218 protruding from an end of the lateral wall 213 near the front wall 211. After finishing the assembly of the fastening equipment, the insulative housing 10 together with pick up cap 30 is put in the stiffener 21, then a whole assembly of the socket assembly 100 is completed.

Referring to FIGS. 3 and 4, the pick up cap 30 pivots to an end of the insulative housing 10 and can follows the loading plate 22 to rotate and open in virtue of latching engagement between the pick up cap 30 and the loading plate 22. Corresponding configurations about the latching engagement will be described in below.

The pressing portion 225 of the loading plate 22 has a through hole 226 and a latching piece 227 upwardly extending into the through hole 226 from an edge of the through hole 226. When the pick up cap 30 is mounted on the insulative housing 10, the loading plate 22 rotates downwardly to a closed position, conjoined with FIGS. 1-2, the operating portion 32 of the pick up cap 30 is aligned with the through hole 226, and the latching piece 227 extends to be under the operating portion 32 to latch with the pick up cap 30 and lock the pick up cap 30 to the loading plate 22. So when the loading plate 22 is rotated to open, the loading plate 22 simultaneously brings the pick up cap 30 to rotate to make a rear end of the pick up cap 30 leave the insulative housing 10, for the latching piece 227 latches with the operating portion 32.

In present embodiment, the loading plate 22 of the socket assembly 100 is formed with the latching piece 227 to latch the pick up cap 30, in alternative embodiments, the pick up cap 30 may provide a latching arm extending into the through hole 226 of the loading plate 22 to latch the loading plate 22, and that also can achieve the object of present invention.

The socket assembly 100 needs to remove the pick up cap 30 before using, FIGS. 5-8 show a removing process of the pick up cap 30, wherein the fastening equipment is omitted. FIG. 5 shows a side view of the pick up cap 30 at a horizontal position, the pick up cap 30 covers the insulative housing 10, the pivot 36 is located within the mounting hole 133, the latching arm 33 latches the insulative housing 10 to retain the pick up cap 30 at the horizontal position.

Figure 6:
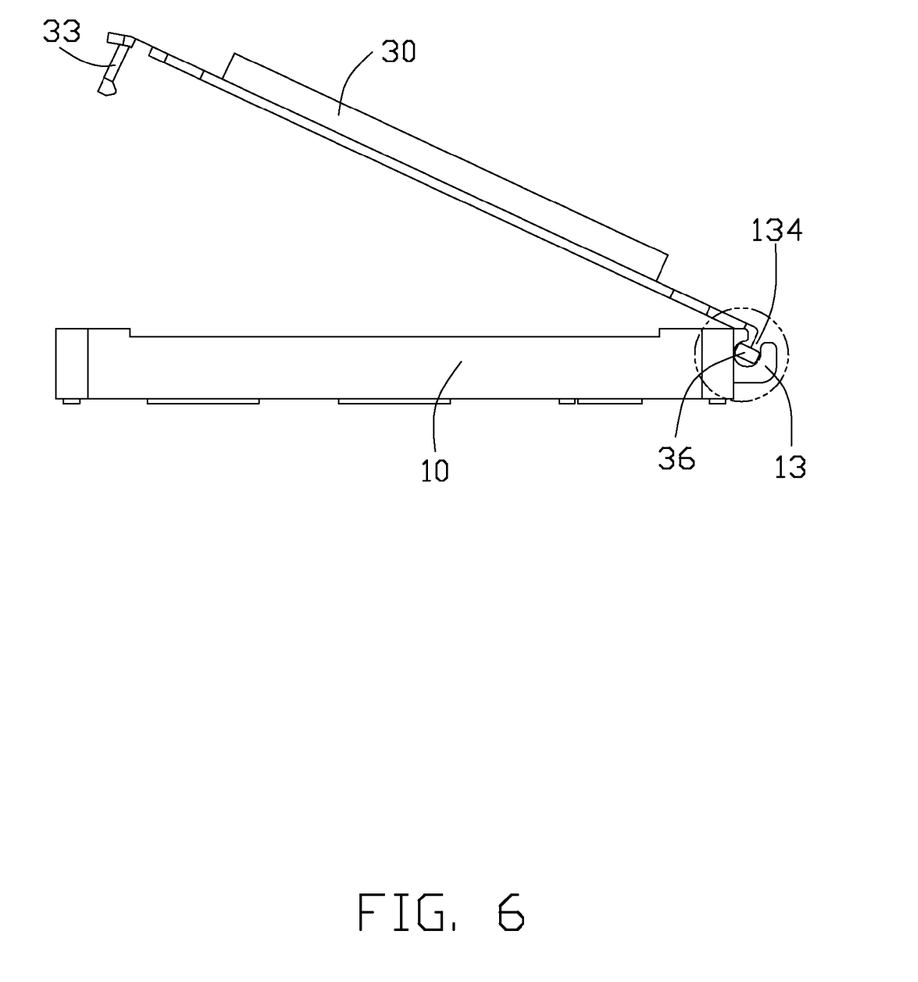
FIG. 6 is another side view of the insulative housing and the pick up cap, wherein the pick up cap rotates to a middle position.
Figure 7:
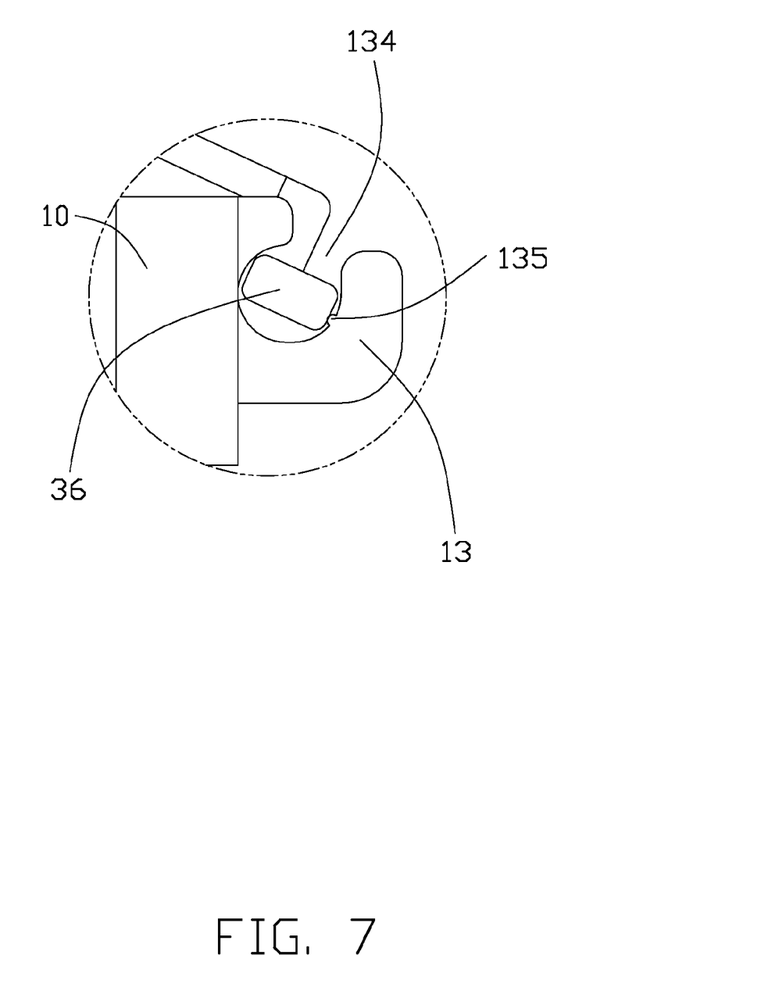
FIG. 7 is an enlarged view of a part of the insulative housing and the pick up cap in FIG. 6 surround by a circle line.

The pivot 36 substantially has a rectangular section with a long side and a short side. The mounting hole 133 which is defined by the base 131 and the accessorial seat 132, has a gap 134, the gap 134 is smaller than the long side but bigger than the short side. The long side of the pivot 36 faces the gap 134 when the pick up cap 30 is located at the horizontal position so that the pivot 36 can not escape from the mounting hole 133. FIG. 6 shows a middle position of the pick up cap 30, the pick up cap 30 follows the loading plate 22 to rotates to the middle position, the long side of the pivot 36 still faces the gap 134, conjoined with FIG.7, the short side of the pivot 36 just abuts against a protrusion 135 within the mounting hole 133 so that the pivot 36 stops at the middle position. Then, the loading plate 22 continues to rotate, the latching piece 227 of the loading plate 22 departs from the operating portion 32 of the pick up cap 30 partially for the blocking of the protrusion 135, and the loading plate 22 alone rotates till completely opening. It is also noted that disengagement of the latching piece 227 from the operating portion 32 is also partially due to the structures in which the pivotal axis of the loading plate 22 and the corresponding radius are different from those of the pick up cap 30, i.e., the pivotal axis of the loading plate 22 being located behind that of the pick up cap 30, and the corresponding rotation radius of the loading plate 22 being larger than that of the pick up cap 30.

Figure 8:
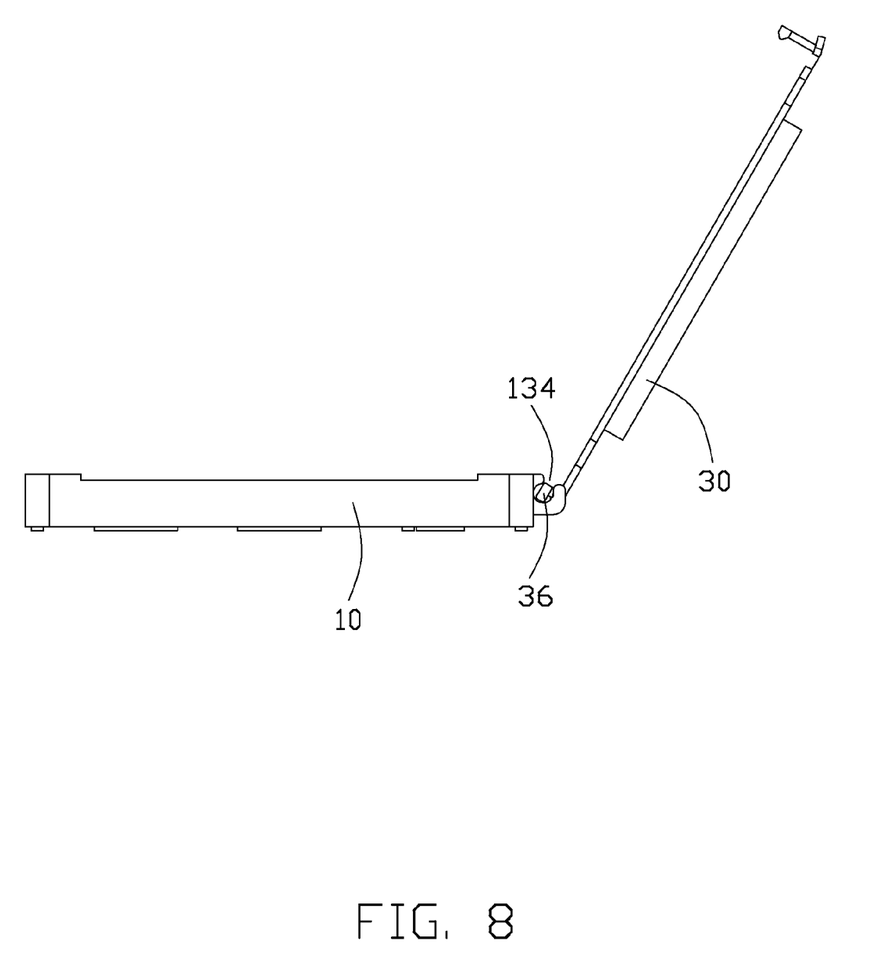
FIG. 8 is another side view of the insulative housing and the pick up cap, wherein the pick up cap rotates to a removing position.
Figure 9:
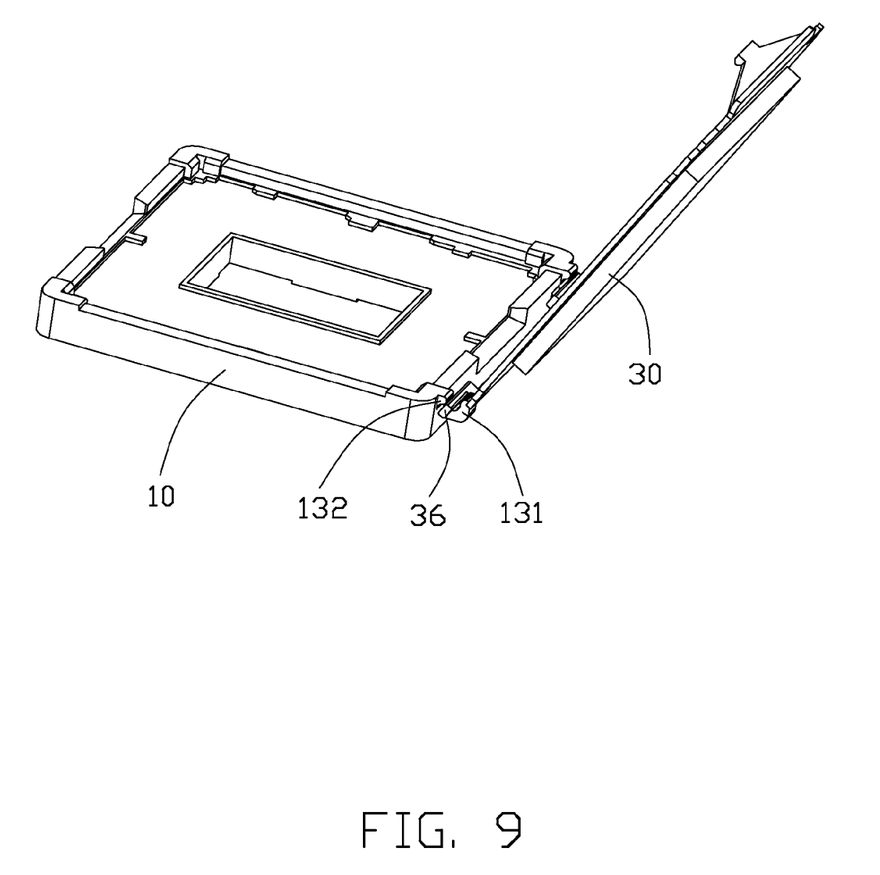
FIG. 9 is a perspective view of the insulative housing and the pick up cap in FIG. 8.

Then, operator pulls the operating portion 32 of the pick up cap 30 and continues to open the pick up cap 30 till the pivot 36 rotates to a certain angle, as shown in FIGS. 8-9, the short side of the pivot 36 faces to the gap 134 at this position, which can be referred as a removing position, operator can easily upwardly remove the pick up cap 30 along an extending direction of the main body 31 at the removing position. An assembly process for assembling the pick up cap 30 to the insulative housing 10 is a reverse process a shown in FIGS. 5-6, 8, here will not give unnecessary details.

When the socket assembly 100 is in use, the loading plate 22 rotates to an opening position. The IC package (not shown) is disposed on the insulative housing 10 and electrically connects with the printed circuit board by the contacts (now shown). The loading plate 22 downwardly rotates to cover the insulative housing 10, then the handle 235 is operated to rotate the operating shaft 232 to a closed position, the bending portion 234 downwardly presses the pressing portion 225 of the loading plate 22, so that the IC package (not shown) is downwardly pressed to reliably contact with the contacts. The operating shaft 232 and the locking portion 218 engage with each other to keep the loading lever 23 and the lading plate 22 at the closed position.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A socket assembly comprising:
   an insulative housing receiving a plurality of contacts and having a plurality of sidewalls;
   a pick up cap assembled on the insulative housing, the pick up cap pivotally assembled to one of the sidewalls of the insulative housing at an end thereof and having an operating portion at an opposite end thereof; and
   a fastening equipment comprising a loading plate covering the insulative housing and the pick up cap, the loading plate linking with the operating portion of the pick up cap and bringing the pick up cap to rotate when the loading plate is rotated to open from a horizontal position relative to the insulative housing.

2. The socket assembly as claimed in claim 1, wherein the loading plate has a through hole and a latching piece upwardly extending from an inner edge of the through hole, the latching piece extends to a room under the operating portion of the pick up cap to latch with the pick up cap.

3. The socket assembly as claimed in claim 2, wherein the fastening equipment comprises a stiffener, an end of the loading plate is pivotally assembled to the stiffener and another end of the loading plate has a downwardly extending pressing portion, which is provided with the through hole and the latching piece.

4. The socket assembly as claimed in claim 3, wherein the pick up cap has a pair of pivots at the end thereof, the sidewall of the insulative housing has a pair of mounting seats, each mounting seat defining a mounting hole, the pivot is received in the mounting hole to pivotally assemble the pick up cap to the insulative housing.

5. The socket assembly as claimed in claim 4, wherein the mounting hole defines a gap, the pivot inserts into the mounting hole from the gap, a section of the pivot has a long side and a short side, and the gap is smaller than the long side but bigger than the short side.

6. The socket assembly as claimed in claim 5, wherein the insulative housing comprises a base and an accessory seat, which both extend outwardly from the sidewall of the insualtive housing.

7. The socket assembly as claimed in claim 5, wherein the mounting hole has a protrusion abutting against the short side when the pivot rotates to a middle position.

8. A socket assembly comprising:
   an insulative housing, receiving a plurality of contacts and having a plurality of sidewalls;
   a pick up cap mounted on the insulative housing, the pick up cap having a main body, a pair of pivots disposed on two ends of a side of the main body, and an operating portion disposed on an opposite side of the main body, the pick up cap pivotally assembled to the insulative housing by the pivots; and
   a loading plate, the loading plate covering the insulative housing and the pick up cap and being rotatable relative to the insulative housing, the loading plate having a pressing portion, the operating portion of the pick up cap and the pressing portion of the loading plate linking with each other so that the pick up cap follows the loading plate to rotate.

9. The socket assembly as claimed in claim 8, wherein the pressing portion of the loading plate has a latching piece, the latching piece extends to a room under the operating portion of the pick up cap to latch with the pick up cap.

10. The socket assembly as claimed in claim 9, wherein the pressing portion has a through hole, the latching piece extends upwardly from an edge of the through hole.

11. The socket assembly as claimed in claim 9, wherein the sidewall of the insulative housing has a pair of mounting seats defining mounting holes, the pivot is received in the mounting hole to pivotally assemble the pick up cap to the insulative housing.

12. The socket assembly as claimed in claim 11, wherein the mounting hole defines a gap, the pivot inserts into the mounting hole from the gap, a section of the pivot has a long side and a short side, and the gap is smaller than the long side but bigger than the short side.

13. The socket assembly as claimed in claim 12, wherein the insulative housing comprises a base and an accessory seat, which both extend outwardly from the sidewall of the insualtive housing.

14. The socket assembly as claimed in claim 12, wherein the mounting hole has a protrusion abutting against the short side when the pivot rotates to a middle position.

* * * * *